United States Patent [19]
Koga

[11] Patent Number: 4,926,133
[45] Date of Patent: May 15, 1990

[54] FM DEMODULATOR HAVING A FREQUENCY INDEPENDENT DELAY CIRCUIT

[75] Inventor: Takashi Koga, Kanagawa, Japan

[73] Assignee: Kabushiki Kaisha Toshiba, Kanagawa, Japan

[21] Appl. No.: 274,263

[22] Filed: Nov. 21, 1988

[30] Foreign Application Priority Data

Nov. 20, 1987 [JP] Japan .................. 62-293451

[51] Int. Cl.$^5$ .................. H03D 3/04; H03D 3/20
[52] U.S. Cl. .................. 329/336; 329/342; 329/343; 375/82
[58] Field of Search .............. 329/126, 137, 145, 336, 329/341, 342, 343; 455/214, 337; 375/80, 82, 94; 307/519; 328/140

[56] References Cited

U.S. PATENT DOCUMENTS

3,778,727 12/1973 Williams .................. 329/145 X
4,435,682 3/1984 Boudault et al. .................. 329/126 X

FOREIGN PATENT DOCUMENTS

55-17532 4/1980 Japan .
55-17533 4/1980 Japan .
58-137308 8/1983 Japan .

OTHER PUBLICATIONS

"FM Demodulator" by Yokoyama, Home VTR Nyumon, Ch. 14, Sec. 1.15, p. 162, 1981.

*Primary Examiner*—Siegfried H. Grimm
*Attorney, Agent, or Firm*—Finnegan, Henderson, Farabow, Garrett and Dunner

[57] ABSTRACT

An FM signal demodulator for converting the frequency of an input signal to a corresponding voltage. The demodulator includes a delay circuit responsive to the input signal for delaying the phase of the input signal by a fixed time, an exclusive-OR gate responsive to the input signal and the delayed phase signal from the delay circuit for outputting a pulse signal having a duration corresponding to the fixed time and an LPF responsive to the pulse signal for generating an output signal having a level which changes in response to changes in the frequency of the input signal.

8 Claims, 7 Drawing Sheets

FM DEMODULATOR HAVING A FREQUENCY INDEPENDENT DELAY CIRCUIT

FIELD OF THE INVENTION

The present invention relates generally to a frequency modulated signal demodulator, and more particularly, to a frequency modulated signal demodulator employing a delay circuit.

BACKGROUND OF THE INVENTION

A frequency modulated signal demodulator (referred to as FM demodulator hereafter) is used to recover data transmitted by frequency modulating a carrier. Many types of FM demodulators have been developed heretofore. In those FM demodulators, a so-called pulse count type FM demodulator or an FM demodulator employing a delay circuit has merit in that it can be constituted of digital devices.

The FM demodulator employing delay circuits has a first gate circuit having an "exclusive-OR" function and receiving at its two inputs pulse signals having the frequency of the frequency modulated signal (referred to as FM signal hereafter), delay means for delaying one of the pulses relative to the other, and a low-pass filter (referred to as LPF hereafter) connected to the output of the first gate circuit.

A pulse count type FM demodulator of the above-described type is disclosed in, for example, U.S. Pat. No. 3,778,727. In prior art pulse count type FM demodulators of this type, a shift register or a delay circuit is employed to produce a fixed delay of one of the input pulses applied to the "exclusive-OR" gate (referred to as EX-OR gate hereafter). This fixed delay is equivalent to a phase shift of the delayed pulse proportional to the frequency. An output pulse formed by the input pulses appearing at the transition instants of the non-delayed input pulse and having a fixed duration is obtained at the output of the EX-OR gate. The LPF connected to the output of the EX-OR gate supplies the average value of the output pulse, which average value is proportional to the phase shift between the delayed and the non-delayed input pulses and, consequently, is proportional to the frequency of the modulated signal. The fixed delay can be realized by means of the delay circuit.

Referring now to FIGS. 1, 2 and 3, a typical example of the conventional pulse count type FM demodulator will be briefly described. As shown in FIG. 1, the example of the conventional pulse count type FM demodulator comprises an input terminal 11, a first wave-shaping circuit 12, an EX-OR gate 13, a delay circuit 14 and an LPF 15. The first wave-shaping circuit 12 is coupled to the input terminal 11. The EX-OR gate 13 is coupled at its first input 13a to the output of the first wave-shaping circuit 12. The delay circuit 14 is coupled between the output of the first wave-shaping circuit 12 and a second input 13b of the EX-OR gate 13. The LPF 15 is coupled to the output of the EX-OR gate 13.

An input FM signal Sfm is supplied to the first wave-shaping circuit 12 from the input terminal 11. The first wave-shaping circuit 12 shapes the input FM signal Sfm into a first pulse signal P1 with a correct rectangular waveform signal, as shown in FIG. 2. FIG. 2 shows signals in the demodulator of FIG. 1 and time relations thereof. In FIG. 2, the left portion shows the signals with a relatively low frequency. The right portion of FIG. 2 shows the signals with a relatively high frequency. The first pulse signal P1 output from the first wave-shaping circuit 12 is supplied to the first input 13a of the EX-OR gate 13.

Further, the first pulse signal P1 is supplied to the delay circuit 14. The delay circuit 14 comprises an integration circuit 16 and a second wave-shaping circuit 17 coupled in series with each other. The second wave-shaping circuit 17 as well as the first wave-shaping circuit 12 are coupled to a power supply source 20 for receiving a prescribed power supply voltage Vcc. The first and second wave-shaping circuits 12 and 17 are further coupled to a ground potential source 21 having a ground potential Vg.

The integration circuit 16 comprises a resistor 18 and a capacitor 19. The resistor 18 is coupled between the output of the first wave-shaping circuit 12 and the input of the second wave-shaping circuit 17. The capacitor 19 is coupled between the right end of the resistor 18, in the drawing, and the ground potential source 21.

The first pulse signal P1 is integrated by the integration circuit 16 so that an integration signal Si, as shown in FIG. 2, is obtained at the right end of the resistor 18. The integration signal Si starts to increase gradually with a predetermined integration curve at the leading edge of the first pulse signal P1. The integration signal Si starts to decrease gradually with the predetermined integration curve at the trailing edge of the first pulse signal P1.

The integration signal Si is supplied to the second wave-shaping circuit 17. Now it is assumed that the first and second wave-shaping circuits 12 and 17 are constituted by using C-MOS devices (Complementary Metal Oxide Semiconductor devices), and the power supply voltage Vcc of 5.0 volts is supplied to the FM demodulator. Then the wave-shaping circuits 12 and 17 have a threshold level Vth at an intermediate level of the power supply voltage Vcc, i.e., 2.5 volts.

The output level of the second wave-shaping circuit 17 changes to the power supply voltage Vcc of 5.0 volts when the integration signal Si exceeds the threshold level Vth, i.e., 2.5 volts. The output level of the second wave-shaping circuit 17 changes to the ground potential of the ground potential source 21, i.e., 0 volts, when the integration signal Si drops below the threshold level Vth, i.e., 2.5 volts. Thus, a second pulse signal P2, as shown in FIG. 2, is obtained from the second wave-shaping circuit 17.

The second pulse signal P2 has a pulse shape equivalent to the first pulse signal P1 output from the first wave-shaping circuit 12, but delayed for a period Td, as described later. The second pulse signal P2 thus delayed relative to the first pulse signal P1 is supplied to the second input 13b of the EX-OR gate 13. The EX-OR gate 13 carries out the "exclusive-OR" operation for the first and second pulse signals P1 and P2 supplied to the first and second inputs 13a and 13b thereof. As a result of the "exclusive-OR" operation, a third pulse signal P3, as shown in FIG. 2, is obtained from the EX-OR gate 13.

The delay time Td of the second pulse signal P2 from the first pulse signal P1 is defined by a period T1 from the instant ta or tb corresponding to the leading or trailing edge of the first pulse signal P1, to the instant tc or td at which the integration signal Si crosses the threshold level Vth in the course of increasing or decreasing. The above period T1 is kept uniform, if the minimum and maximum levels Vmin and Vmax of the integration signal Si are fixed. Another period T2 from the instant tc or td to the instant tb or ta varies in accordance with the frequency of the input FM signal Sfm. When the frequency of the input FM signal Sfm is relatively low, as shown by the left portion in FIG. 2, the third pulse P3 output from the EX-OR gate 13 has a wide OFF pulse period. When the frequency of the input FM signal Sfm is relatively high, as shown by the right portion in FIG. 2, the third pulse P3 output from the EX-OR gate 13 has a narrow OFF pulse period.

The third pulse P3 is supplied to the LPF 15. The LPF 15 smoothes signals input thereto so that a signal Sa having an average level of the third pulse P3 is obtained from the LPF 15. An amplitude voltage Va of the output signal Sa equivalent to the average level of the third pulse P3 varies dependent upon the duration of the OFF pulse period of the third pulse P3. The signal Sa output from the LPF 15 is obtained as an FM demodulation signal from an output terminal 22 of the FM demodulator, which is coupled to the LPF 15.

Thus, the amplitude Va of the FM demodulation signal Sa is relatively small, as shown by the left portion in FIG. 2, when the frequency of the input FM signal Sfm is relatively low. The amplitude Va of the FM demodulation signal Sa is relatively large, as shown by the right portion in FIG. 2, when the frequency of the input FM signal Sfm is relatively high.

The conventional FM demodulator of FIG. 1, however, has a drawback in which the FM demodulation signal Sa obtained thereby has an insufficient response characteristic to the frequency of the input FM signal Sfm. This is because the delay time Td of the second pulse signal P2 from the first pulse signal P1 varies in accordance with the frequency of the input FM signal Sfm, in spite of the fact that the delay time Td must be kept uniform.

As shown in FIG. 2, the amplitude of the integration signal Si becomes large when the frequency of the input FM signal Sfm is low. Thus, the minimum and maximum levels Vmin and Vmax of the integration signal Si go away from the threshold level Vth. On the other hand, the amplitude of the integration signal Si becomes small when the frequency of the input FM signal is high. Thus, the minimum and maximum levels Vmin and Vmax of the integration signal Si approach the threshold level Vth.

The minimum and maximum levels Vmin and Vmax define the initial values at the start of the integrating operations. The minimum and maximum levels Vmin and Vmax of the integration signal Si distant from the threshold level Vth make the delay time Td longer, as shown by the left portion in FIG. 2. On the other hand, the minimum and maximum levels Vmin and Vmax of the integration signal Si close to the threshold level Vth make the delay time Td shorter, as shown by the right portion in FIG. 2.

Thus, the conventional FM demodulator has a response characteristic, as shown in FIG. 3. As shown in FIG. 3, the demodulation output voltage Va of the FM demodulation signal Sa does not respond linearly to the frequency of the input FM signal Sfm.

In order to avoid the drawback, another prior art FM demodulator, for example, U.S. Pat. No. 4,435,682 has been proposed. FIG. 3 of the patent discloses an FM demodulator employing delay circuits. In the FM demodulator of the patent, a differentiation waveform signal is obtained by an exclusive-OR operation for signals supplied from both an input circuit and an output circuit. Thus, the construction of the FM demodulator of the patent is very complicated. Further, the FM demodulator of the patent is difficult for maintaining timings of signals in stable relations.

SUMMARY OF THE INVENTION

An object of the present invention is to provide an FM demodulator, employing delay circuits, which has an improved demodulation output response characteristic.

Another object of the present invention is to provide an FM demodulator employing delay circuits in which the delay time of the delay circuits is kept uniform in spite of frequency variations of the input FM signal.

In order to achieve the above object, an FM demodulator employing delay circuits according to one aspect of the present invention includes a delay circuit responsive to the input signal for delaying the phase of the input signal by a fixed time, an exclusive-OR gate responsive to the input signal and the delayed phase signal from the delay circuit for outputting a pulse signal having a duration corresponding to the fixed time and an LPF responsive to the pulse signal for generating an output signal having a level which changes in response to changes in the frequency of the input signal.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
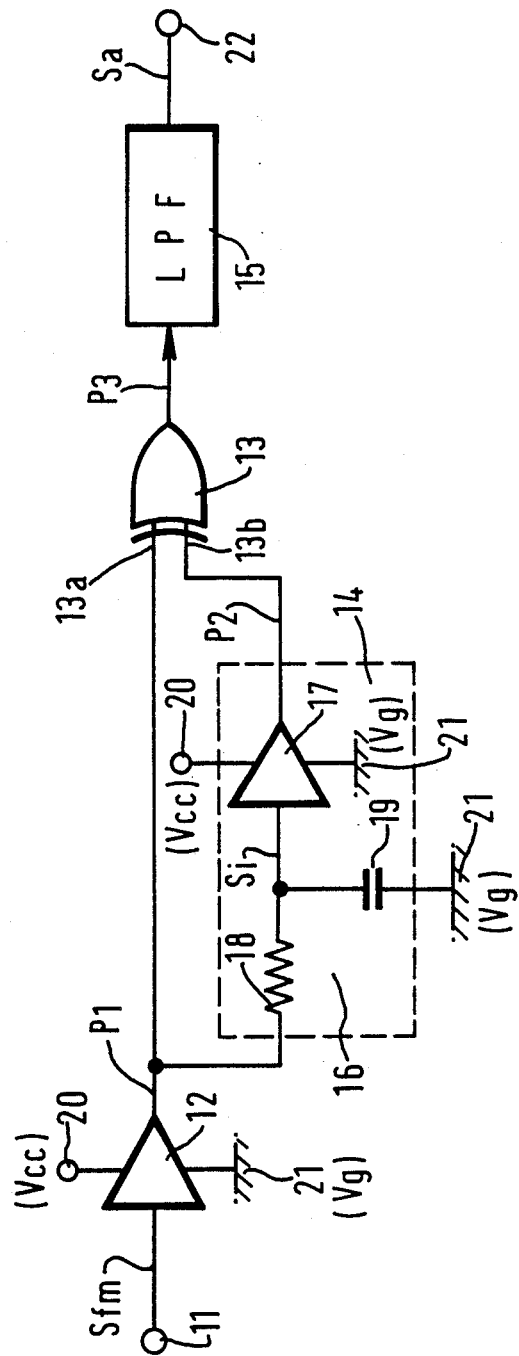
FIG. 1 is a circuit diagram showing a conventional pulse count type FM demodulator.
Figure 2:
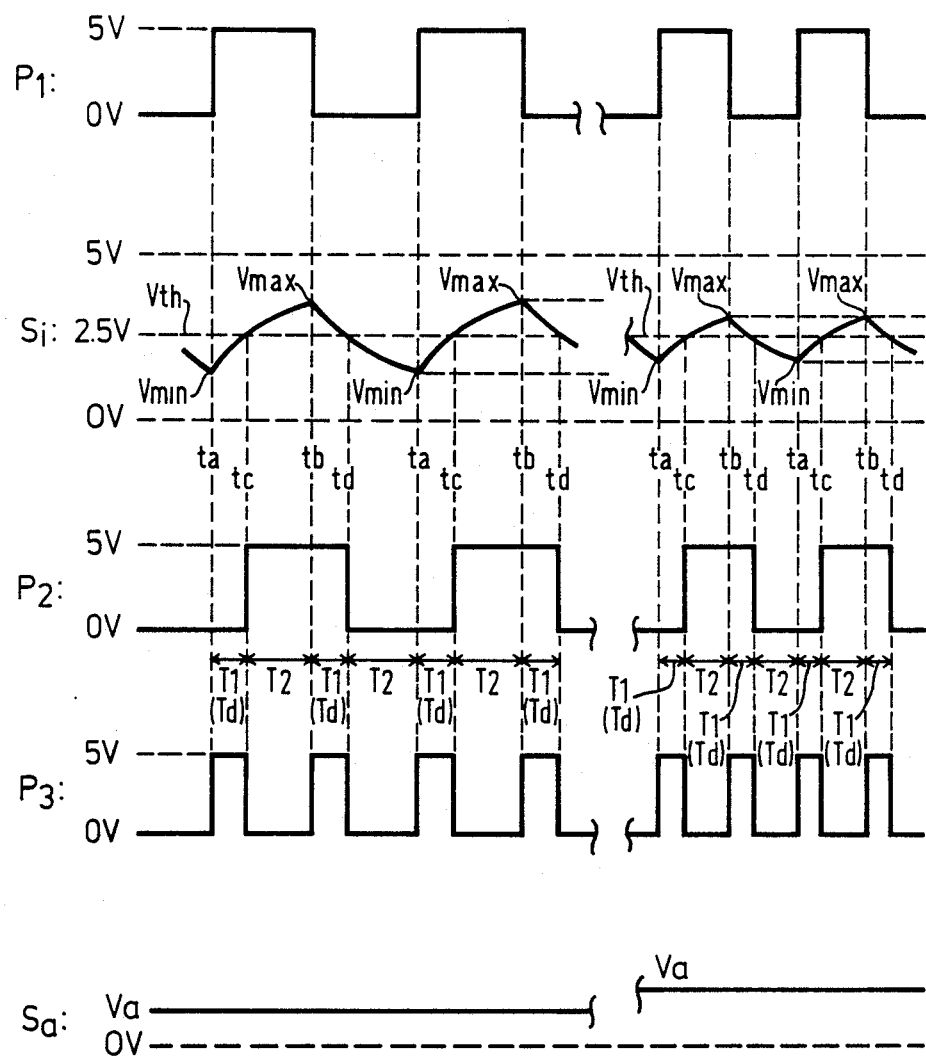
FIG. 2 is a graph showing signals in the FM demodulator of FIG. 1 and time relations thereof.

The present invention will be described in detail with reference to FIGS. 4 through 9. Throughout the drawings, reference numerals or letters used in FIGS. 1 and 2 (Prior Art) will be used to designate like or equivalent elements for simplicity of explanation.

Figure 6:
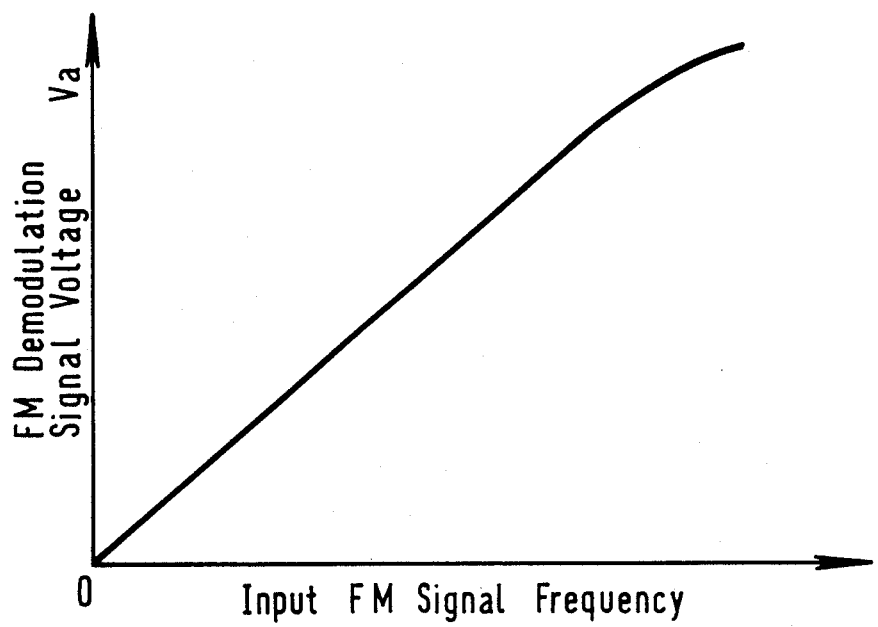
FIG. 6 is a graph showing the response characteristic of the FM demodulator of FIG. 4 to the frequency change.
Figure 4:
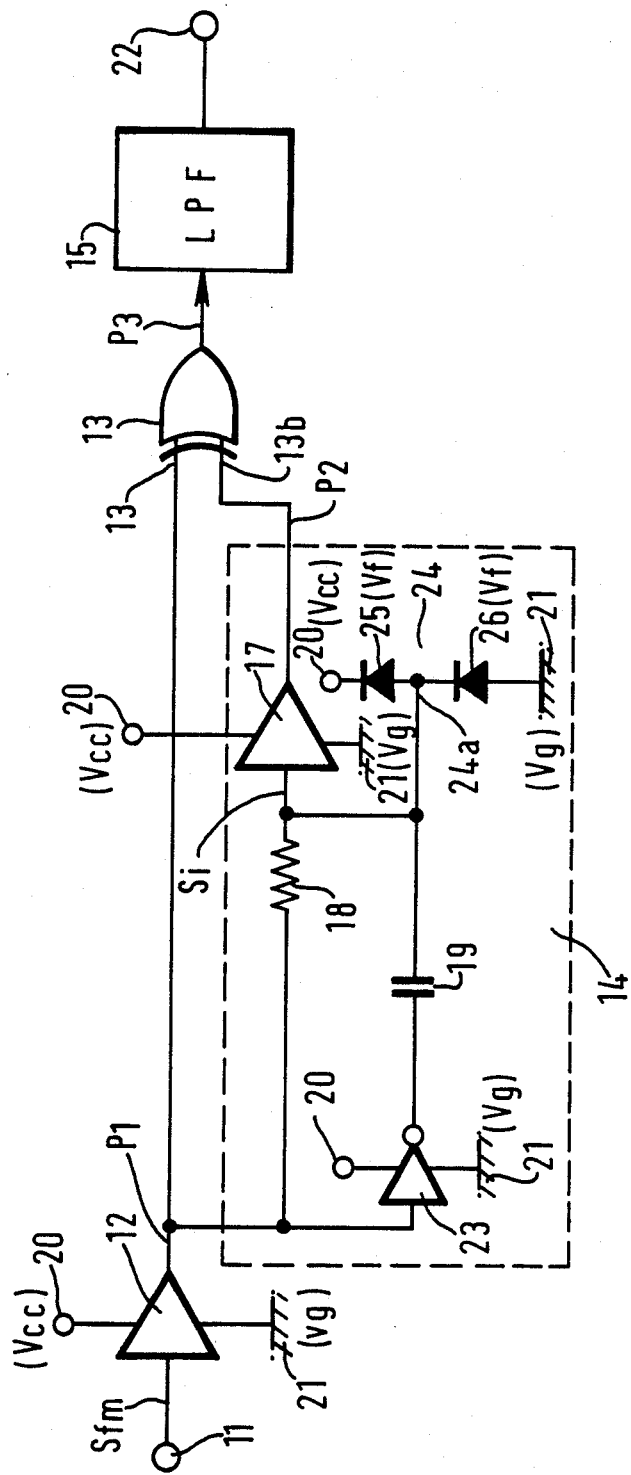
FIG. 4 is a circuit diagram showing a first embodiment of the FM demodulator according to the present invention.
Figure 5:
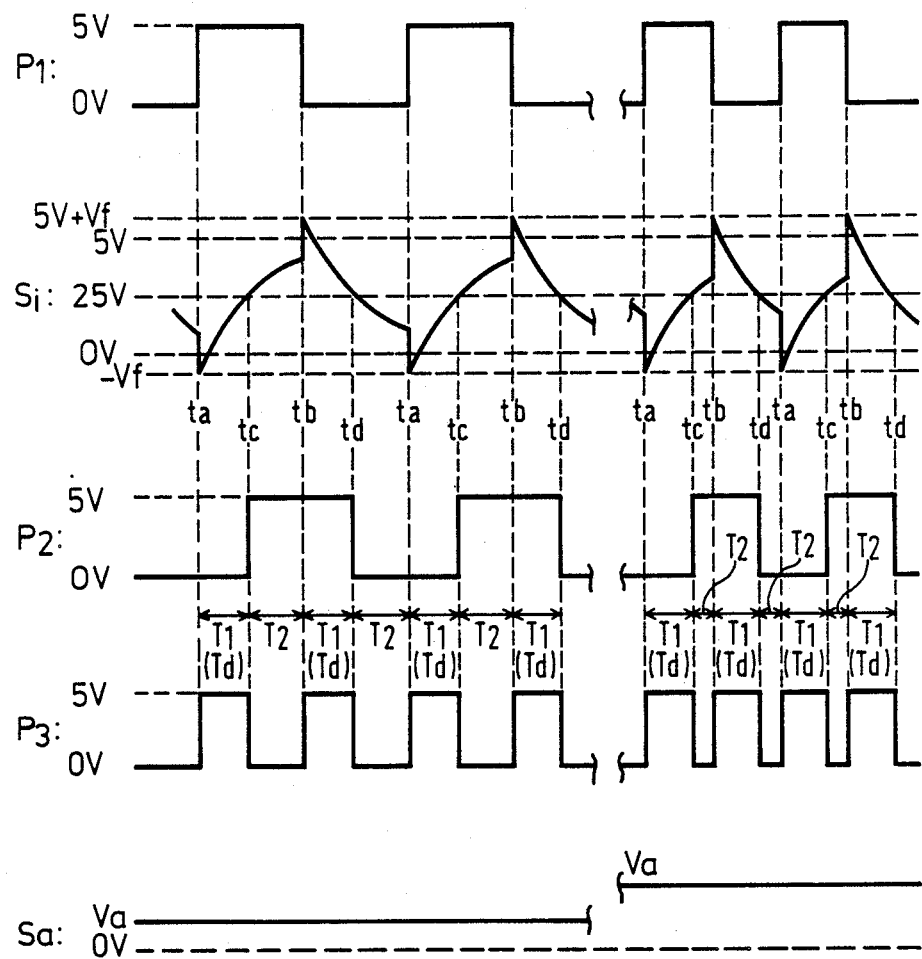
FIG. 5 is a graph showing signals in the FM demodulator of FIG. 4 and time relations thereof.

Referring now to FIGS. 4, 5 and 6, a first embodiment of the FM demodulator employing delay circuits according to the present invention will be described in detail.

As shown in FIG. 4, the first embodiment of the FM demodulator comprises an input terminal 11, a first wave-shaping circuit 12, an EX-OR gate 13, a delay circuit 14 and an LPF 15. The first wave-shaping circuit 12 is coupled to the input terminal 11. The EX-OR gate 13 is coupled at its first input 13a to the output of the first wave-shaping circuit 12. The delay circuit 14 is coupled between the output of the first wave-shaping circuit 12 and a second input 13b of the EX-0R gate 13. The LPF 15 is coupled to the output of the EX-0R gate 13.

An input FM signal Sfm is supplied to the first wave-shaping circuit 12 from the input terminal 11. The first wave-shaping circuit 12 shapes the input FM signal Sfm into a first pulse signal P1 with a correct rectangular waveform signal, as shown in FIG. 5. FIG. 5 shows signals in the demodulator of FIG. 4 and time relations thereof. In FIG. 5, the left portion shows the signals with a relatively low frequency. The right portion shows the signals with a relatively high frequency. The first pulse signal P1 output from the first wave-shaping circuit 12 is supplied to the first input 13a of the EX-OR gate 13.

Further, the first pulse signal P1 is supplied to the delay circuit 14. The delay circuit 14 comprises a second wave-shaping circuit 17, a resistor 18, a capacitor 19, an inverter 23 and a voltage clamp circuit 24. The resistor 18 and the second wave-shaping circuit 17 are coupled in series between the first wave-shaping circuit 12 and the second input 13b of the EX-OR gate 13. The inverter 23 and the capacitor 19 are coupled in series between the first wave-shaping circuit 12 and the right end of the resistor 18, i.e., the end coupled to the second wave-shaping circuit 17. Thus, the series circuit of the inverter 23 and the capacitor 19 is coupled in parallel to the resistor 18.

The first and second wave-shaping circuits 12 and 17 and the inverter 23 are coupled to a power supply source 20 for receiving a prescribed power supply voltage Vcc. These circuits 12, 17 and 23 further are coupled to a ground potential source 21 with a ground potential Vg.

The voltage clamp circuit 24 comprises a pair of first and second diodes 25 and 26 which are connected in series in the forward bias direction between the power supply source 20 and the ground potential source 21. An output end 24a of the voltage clamp circuit 24 constituted by the coupling node between the first and second diodes 25 and 26 is coupled to the right end of the resistor 18.

In the delay circuit 14, the first pulse signal P1 is applied parallel to two paths, i.e., a first path including the resistor 18, and a second path including the inverter 23 and the capacitor 19. The first pulse signal P1 applied to the first path flows into the ground potential source 21 or the power supply source 20 through the resistor 18, the capacitor 19 and the inverter 23 in this order. Thus the first pulse signal P1 is integrated by combination of the resistor 18 and the capacitor 19. On the other hand, the first pulse signal P1 applied to the second path flows into the ground potential source 21 or the power supply source 20 through the inverter 23, the capacitor 19 and the voltage clamp circuit 24 in this order. Thus the first pulse signal P1 is differentiated by the combination of the capacitor 19 and the resistor 18 in this order.

Referring now to FIG. 5, the operation of the first embodiment of FIG. 4 will be described in detail. At an instant ta corresponding to the leading edge of the first pulse signal P1, the output level of the inverter 23 drops to the ground potential Vg, i.e., 0 volts. At this moment, a current flows through the capacitor 19 and the resistor 18 so that the differential operation of the capacitor 19 and the resistor 18 is carried out. As a result, the potential on the right end of the resistor 18 decreases rapidly to a clamp voltage "−Vf", i.e., a first fixed voltage, as described later. The first and second diodes 25 and 26 have a prescribed forward voltage drop Vf. Thus, the potential of the output end 24a of the voltage clamp circuit 24 lowers below the ground potential Vg by the forward voltage drop "Vf". As a result, the first fixed potential "−Vf" is obtained by the voltage clamp circuit 24 at the instant ta. The first fixed potential "−Vf" is applied to the right end of the resistor 18.

The ON pulse voltage of the first pulse signal P1 after the instant ta is integrated by the series circuit of the resistor 18 and the capacitor 19. The first fixed potential "−Vf" defines the initial value for the integrating operation at that period. Thus, an integration signal Sl, as shown in FIG. 5, gradually increases from the first fixed potential "−Vf".

At an instant tb corresponding to the trailing edge of the first pulse signal P1, the output level of the inverter 23 becomes the power supply voltage Vcc, i.e., 5.0 volts. At this moment, another current flows through the resistor 18 and the capacitor 19 so that the differential operation of the resistor 18 and the capacitor 19 is carried out. As a result, the potential on the right end of the resistor 18 increases rapidly to another clamp voltage, i.e., a second fixed potential "5.0 volts+Vf", as described later. Thus, the potential of the output end 24a of the voltage clamp circuit 24 extends the power supply voltage Vcc by the forward voltage drop Vf of the first diode 25. As a result, the second fixed potential "5.0 volts+Vf" is obtained by the voltage clamp circuit 24 at the instant tb. The second fixed potential "5.0 volts+Vf" is applied to the right end of the resistor 18.

The OFF pulse voltage of the first pulse signal P1 after the instant tb is integrated by the series circuit of the resistor 18 and the capacitor 19. The first fixed potential "−Vf" defines the initial value for the integrating operation at that period. Thus, the integration signal Sl lowers gradually from the second fixed potential "5.0 volts+Vf", as shown in FIG. 5.

The integration signal Si is supplied to the second wave-shaping circuit 17. Now it is assumed that the first and second wave-shaping circuits 12 and 17 are constituted by using C-MOS devices, and the power supply voltage Vcc of 5.0 volts is supplied to the FM demodulator. Then the wave-shaping circuits 12 and 17 have a threshold level Vth at an intermediate level of the power supply voltage Vcc, i.e., 2.5 volts.

The output level of the second wave-shaping circuit 17 changes to the power supply voltage Vcc of 5.0 volts, when the integration signal Si exceeds the threshold level Vth, i.e., 2.5 volts. The output level of the second wave-shaping circuit 17 changes to the ground potential of the ground potential source 21, i.e., 0 volts, when the integration signal Si lowers below the threshold level Vth, i.e., 2.5 volts. Thus, a second pulse signal P2, as shown in FIG. 5, is obtained from the second wave-shaping circuit 17.

The second pulse signal P2 has a pulse shape equivalent to the first pulse signal P1 output from the first wave-shaping circuit 12 but delayed for a period as described later. The second pulse signal P2 thus delayed with respect to the first pulse signal P1 is supplied to the second input 13b of the EX-OR gate 13. The EX-OR gate 13 carries out the "exclusive-OR" operation for the first and second pulse signals P1 and P2 supplied to the first and second inputs 13a and 13b thereof. As a result of the "exclusive-OR" operation, a third pulse signal P3, as shown in FIG. 5, is obtained from the EX-0R gate 13.

The delay time Td of the second pulse signal P2 from the first pulse signal P1 is defined by a period T1 from the instant ta or tb corresponding to the leading or trailing edge of the first pulse signal P1 to the instant tc or td at which the integration signal Si crosses the threshold level Vth in the course of increasing or decreasing. The above period T1 is kept uniform, because the initial values for the integrating operations coincide with the first and second fixed potentials "−Vf" and "5.0 volts+Vf". Another period T2 from the instant tc or td to the instant tb or ta varies in accordance with the frequency of the input FM signal Sfm. When the frequency of the input FM signal Sfm is relatively low, as shown by the left portion in FIG. 2, the third pulse P3 output from the EX-0R gate 13 has a wide OFF pulse period. When the frequency of the input FM signal Sfm is relatively high, as shown by the right portion in FIG. 2, the third pulse P3 output from the EX-0R gate 13 has a narrow OFF pulse period.

The third pulse P3 is supplied to the LPF 15. The LPF 15 smooths signals input thereto so that a signal Sa having an average level of the third pulse P3 is obtained from the LPF 15. An amplitude voltage Va of the output signal Sa equivalent to the average level of the third pulse P3 varies dependent upon the duration of the OFF pulse period of the third pulse P3. The signal Sa output from the LPF 15 is obtained as an FM demodulation signal from an output terminal 22 of the FM demodulator, which is coupled to the LPF 15.

Thus, the amplitude Va of the FM demodulation signal Sa is relatively small, as shown by the left portion in FIG. 5, when the frequency of the input FM singal Sfm is relatively low. The amplitude Va of the FM demodulation signal Sa is relatively large, as shown by the right portion in FIG. 5, when the frequency of the input FM signal Sfm is relatively high.

According to the FM demodulator of FIG. 4, the FM demodulation signal Sa obtained thereby has a sufficient response characteristic to the frequency of the input FM signal Sfm. This is because the delay time Td of the second pulse signal P2 from the first pulse signal P1 is kept constant, in spite of the frequency variation of the input FM signal Sfm.

Figure 3:
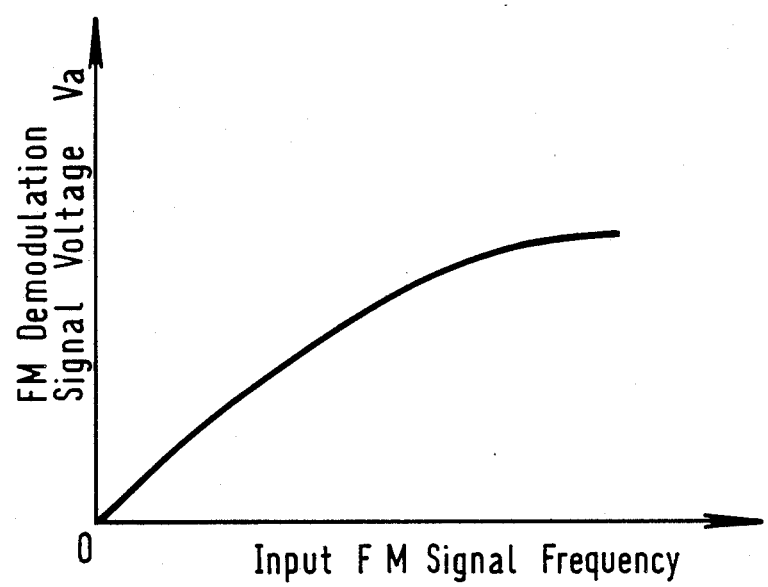
FIG. 3 is a graph showing the response characteristic of the FM demodulator of FIG. 1 to the frequency change.

Thus, the FM demodulator of FIG. 4 has the response characteristic, as shown in FIG. 6. As shown in FIG. 6, the demodulation output voltage Va of the FM demodulation signal Sa linearly responds to the frequency of the input FM signal Sfm with a good linearity in comparison to the response characteristic, as shown in FIG. 3, of the conventional FM demodulator.

Figure 7:
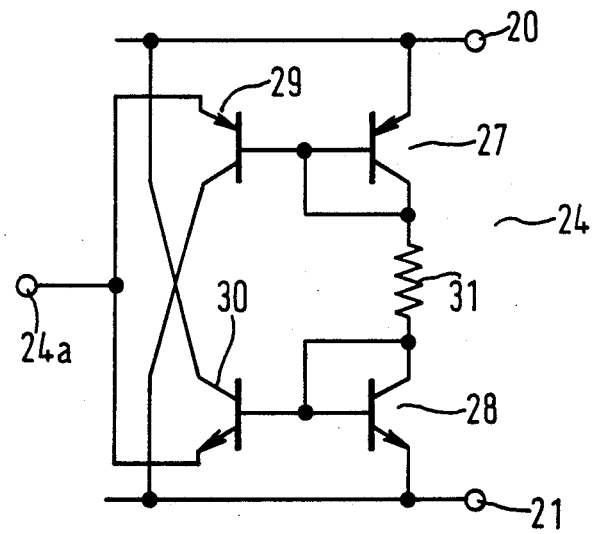
FIG. 7 is a circuit diagram showing a modification of the voltage clamp circuit 24 of FIG. 4.

FIG. 7 shows a modification of the voltage clamp circuit 24. The voltage clamp circuit 24 of FIG. 7 comprises four transistors 27, 28, 29 and 30 and a resistor 31. First and second transistors 27 and 28 are coupled in a diode fashion by themselves, respectively, The first and second transistors 27 and 28 and the resistor 31 are coupled in series between the power supply source 20 and the ground potential source 21 in this order. The resistor 31 limits the current flowing through the series circuit. Thus, the collectors of the transistors 27 and 28 are coupled together through the resistor 31. The base of the first transistor 27 is coupled to the base of the third transistor 29. The base of the second transistor 28 is coupled to the base of the fourth transistor 30.

The collectors of the fourth and third transistors 29 and 30 are connected to the ground potential source 21 and the power supply source 20, respectively. The emitters of the third and fourth transistors 29 and 30 are coupled together. An output end 24a of the voltage clamp circuit 24 of FIG. 7 is drawn from the connection node of the emitters of the third and fourth transistors 29 and 30.

According to the voltage clamp circuit 24 of FIG. 7, currents for obtaining fixed potentials flow through the third transistor 29 or the fourth transistor 30. The voltage clamp circuit 24 of FIG. 7 has a very small offset voltage in comparison to the voltage clamp circuit 24 of FIG. 4. This is because forward voltage drops "Vfs" of the third and fourth transistors 29 and 30 cancel each other. Thus, the voltage clamp circuit 24 of FIG. 7 can provide the uniform initial values of 0 volts and 5.0 volts for the integrating operations of the circuit of FIG. 4.

Figure 8:
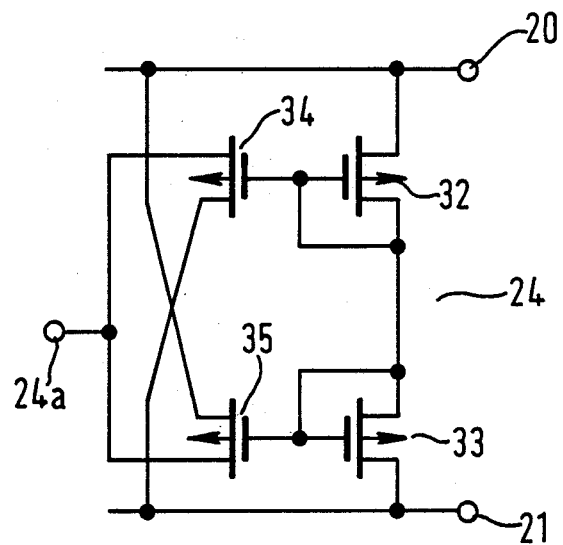
FIG. 8 is a circuit diagram showing another modification of the voltage clamp circuit 24 of FIG. 4.

FIG. 8 shows another modification of the voltage clamp circuit 24. The voltage clamp circuit 24 of FIG. 8 comprises four MOS FETS 32, 33, 34 and 35. First and second MOS FETS 28 are coupled in a diode fashion by themselves, respectively. The first and second MOS FETS 32 and 33 are coupled in series between the power supply source 20 and the ground potential source 21 in this order. Thus, the drains of the MOS FETS 32 and 33 are coupled together. The gate of the first MOS FET 32 is coupled to the gate of the third MOS FET 34. The gate of the second MOS FET 33 is coupled to the gate of the fourth MOS FET 35.

The drains of the fourth and third MOS FETS 35 and 34 are connected to the ground potential source 21 and the power supply source 20, respectively. The sources of the third and fourth MOS FETS 34 and 35 are coupled together. An output end 24a of the voltage clamp circuit 24 of FIG. 8 is drawn from the connection node of the sources of the third and fourth MOS FETS 34 and 35.

According to the voltage clamp circuit 24 of FIG. 8, currents for obtaining fixed potentials flow through the third MOS FET 34 or the fourth MOS FET 35. The voltage clamp circuit 24 of FIG. 8 also has a very small offset voltage. This is because threshold voltages of the first and second MOS FETS 32 and 33 cancel each other, and also the threshold voltages of the third and fourth transistors 34 and 35 cancel each other. Thus, the voltage clamp circuit 24 of FIG. 8 can provide the uniform initial values of 0 volts and 5.0 volts for the integrating operations of the circuit of FIG. 4. The voltage clamp circuit 24 of FIG. 8 also is compatible with FM demodulators using C-MOS devices.

Figure 9:
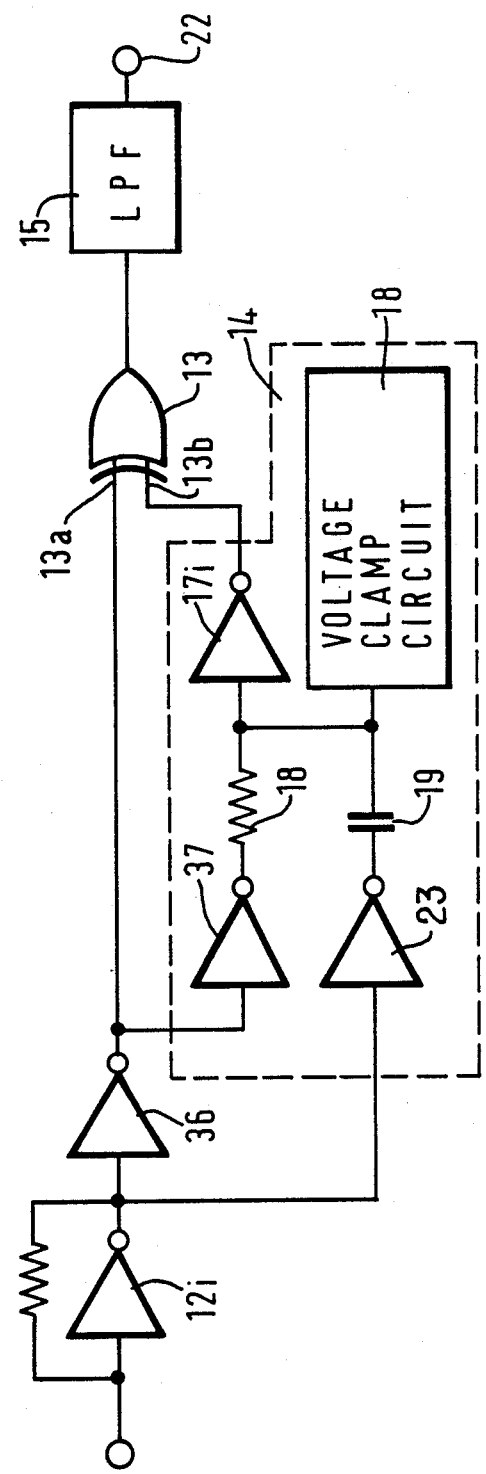
FIG. 9 is a circuit diagram showing a second embodiment of the FM demodulator according to the present invention.

FIG. 9 shows a second embodiment of the FM demodulator according to the present invention. In the second embodiment of the FM demodulator, first and second wave-shaping circuits 12 and 17 are constituted by using inverter devices like the inverter 23. Inverters 12i and 17i correspond to the first and second wave-shaping circuits 12 and 17 in the first embodiment of FIG. 4. The FM demodulator of FIG. 9 further comprises other inverters, i.e., fourth and fifth inverters 36 and 37. The fourth and fifth inverters 36 and 37 are provided for compensating phases of the pulse signals P1 and P2 against the first and second inverter type wave-shaping circuits 12i and 17i.

As described above, the present invention can provide an extremely preferable FM demodulator employing delay circuits.

While there has been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. An FM signal demodulator for converting the frequency of an input signal to a corresponding voltage comprising:

delay circuit means responsive to the input signal for delaying the input signal by a fixed time, said delay circuit means including integrating circuit means for modifying the waveform of the input signal, delay wave-shaping means for reshaping the modified waveform into a substantially rectangular shape, and clamp circuit means for supplying a predetermined fixed voltage to the integrating circuit means;

exclusive-OR gate means responsive to the input signal and the delayed input signal from the delay circuit means for outputting a pulse signal having a duration corresponding to the fixed time; and means responsive to the pulse signal for generating an output signal having a level which changes in response to changes in the frequency of the input signal.

2. The demodulator of claim 1 also including input wave-shaping means for converting the waveform of the input signal into a rectangular shaped signal being supplied to the delay circuit means and the gate means.

3. The demodulator of claim 1 wherein the delay circuit means also includes an inverter means coupled to the clamp circuit means for controlling the timing of the integrating circuit means.

4. The demodulator of claim 1 wherein the clamp circuit means includes a diode having a fixed forward voltage drop.

5. The demodulator of claim 1 wherein the clamp circuit means includes a plurality of bipolar transistor devices.

6. The demodulator of claim 1 wherein the clamp circuit means includes a plurality of MOS FET devices.

7. The demodulator of claim 2 wherein the input wave-shaping means and the delay wave-shaping means each includes an inverter.

8. The demodulator of claim 7 also including a plurality of phase change inverter corresponding to each of the wave-shaping means.

* * * * *